United States Patent
Obradovic et al.

(10) Patent No.: US 9,178,045 B2
(45) Date of Patent: Nov. 3, 2015

(54) INTEGRATED CIRCUIT DEVICES INCLUDING FINFETS AND METHODS OF FORMING THE SAME

(71) Applicants: Borna J. Obradovic, Leander, TX (US); Robert C. Bowen, Austin, TX (US); Mark S. Rodder, Dallas, TX (US)

(72) Inventors: Borna J. Obradovic, Leander, TX (US); Robert C. Bowen, Austin, TX (US); Mark S. Rodder, Dallas, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/489,965

(22) Filed: Sep. 18, 2014

(65) Prior Publication Data

US 2015/0093868 A1    Apr. 2, 2015

Related U.S. Application Data

(60) Provisional application No. 61/883,235, filed on Sep. 27, 2013.

(51) Int. Cl.

| | |
|---|---|
| *H01L 29/66* | (2006.01) |
| *H01L 29/16* | (2006.01) |
| *H01L 21/265* | (2006.01) |
| *H01L 21/266* | (2006.01) |
| *H01L 21/306* | (2006.01) |
| *H01L 21/308* | (2006.01) |
| *H01L 21/82* | (2006.01) |
| *H01L 29/161* | (2006.01) |
| *H01L 29/165* | (2006.01) |
| *H01L 21/8234* | (2006.01) |
| *H01L 21/8238* | (2006.01) |
| *H01L 29/78* | (2006.01) |

(52) U.S. Cl.
CPC ........ *H01L 29/66795* (2013.01); *H01L 21/266* (2013.01); *H01L 21/26513* (2013.01); *H01L 21/308* (2013.01); *H01L 21/30604* (2013.01); *H01L 21/823431* (2013.01); *H01L 21/823821* (2013.01); *H01L 29/16* (2013.01); *H01L 29/161* (2013.01); *H01L 29/165* (2013.01); *H01L 29/785* (2013.01)

(58) Field of Classification Search
CPC .................... H01L 29/7831; H01L 29/66795; H01L 29/7856; H01L 29/78645; H01L 21/845; H01L 21/823821
USPC .................. 438/157, 176, 283; 257/E21.623
See application file for complete search history.

(56) References Cited

U.S. PATENT DOCUMENTS

| | | | |
|---|---|---|---|
| 7,060,539 B2 | 6/2006 | Chidambarrao et al. | |
| 7,749,842 B2 | 7/2010 | Zhu et al. | |
| 8,048,723 B2 | 11/2011 | Chang et al. | |
| 8,053,299 B2 | 11/2011 | Xu | |
| 8,114,746 B2 | 2/2012 | Wei et al. | |
| 8,264,032 B2 | 9/2012 | Yeh et al. | |
| 2011/0147711 A1* | 6/2011 | Pillarisetty et al. | 257/24 |
| 2013/0001591 A1 | 1/2013 | Wu et al. | |
| 2013/0200454 A1 | 8/2013 | Anderson et al. | |

\* cited by examiner

*Primary Examiner* — Thanhha Pham
(74) *Attorney, Agent, or Firm* — Myers Bigel Sibley & Sajovec, P.A.

(57) ABSTRACT

Integrated circuit devices including fin field-effect transistors (finFETs) and methods of forming the same are provided. The methods may include forming a fin-shaped channel region including germanium on a substrate and forming a source/drain region adjacent the channel region on the substrate. The methods may further include forming a barrier layer contacting sidewalls of the channel region and the source/drain region, and the barrier layer may include $Si_xGe_{1-x}$, and x may be in a range of about 0.05 to about 0.2.

22 Claims, 13 Drawing Sheets

INTEGRATED CIRCUIT DEVICES INCLUDING FINFETS AND METHODS OF FORMING THE SAME

CROSS-REFERENCE TO RELATED APPLICATION

This application claims priority of U.S. Provisional Application Ser. No. 61/883,235, entitled HIGH PERFORMANCE GE FINFET WITH LOW BAND-TO-BAND TUNNELING LEAKAGE CURRENT, filed in the USPTO on Sep. 27, 2013, the disclosure of which is hereby incorporated by reference in its entirety.

FIELD

The present disclosure generally relates to the field of electronics and, more particularly, to methods of forming integrated circuit devices.

BACKGROUND

FinFETs (Fin Field-Effect Transistors) including pure germanium channels have been developed to increase carrier mobility. However, pure germanium channels may have higher leakage currents than silicon channels due to a larger band-to-band tunneling (BTBT) current in a drain region. A band-to-band tunneling current may be larger in germanium than in silicon because a direct bandgap in germanium is smaller than a direct bandgap in silicon.

SUMMARY

A method of forming a finFET may include forming a fin-shaped channel region including germanium on a substrate and forming a source/drain region adjacent the channel region on the substrate. The method may also include forming a barrier layer contacting sidewalls of the channel region and the source/drain region. The barrier layer may include $Si_xGe_{1-x}$, and the value of x may be in a range of about 0.05 to about 0.2.

According to various embodiments, a germanium concentration in the channel region may be greater than a germanium concentration in the barrier layer.

In various embodiments, forming the channel region may include forming the channel region including $Si_{1-y}Ge_y$, and forming the source/drain region may include forming a portion of the source/drain region including substantially pure germanium. The value of y may be in a range of about 0.8 to about 1. According to various embodiments, a germanium concentration in the channel region may be greater than a germanium concentration in the barrier layer, and a germanium concentration in the source/drain region may be substantially equal to or greater than the germanium concentration in the barrier layer. According to various embodiments, the method may further include forming a contact region contacting an upper surface of the source/drain region, and the portion of the source/drain region including substantially pure germanium may contact the contact region.

In various embodiments, forming the channel region may include forming the channel including $Si_{1-y}Ge_y$, and forming the source/drain region may include forming a portion of the source/drain region including substantially pure silicon. The value of y may be in a range of about 0.85 to about 1. According to various embodiments, a germanium concentration in the channel region may be greater than a germanium concentration in the barrier layer. According to various embodiments, the method may further include forming a contact region contacting an upper surface of the source/drain region, and the portion of the source/drain region including substantially pure silicon may contact the contact region.

According to various embodiments, forming the channel region and the barrier layer may include forming a preliminary channel region on the substrate, forming a mask pattern on the preliminary channel region, etching the preliminary channel region using the mask pattern as an etching mask to form the channel region and then epitaxially growing the barrier layer using the channel region as a seed layer.

In various embodiments, forming the mask pattern may include forming a first mask pattern on the preliminary channel region and forming spacer patterns on opposing sidewalls of the first mask pattern.

In various embodiments, etching the preliminary channel region may include etching the preliminary channel region until a depth of an etched portion of the preliminary channel region reaches a predetermined depth.

According to various embodiments, forming the channel region and the barrier layer may include forming a preliminary channel region on the substrate, forming a first mask pattern on a first portion of the preliminary channel region, implanting silicon ions into the preliminary channel region using the first mask pattern as an implantation blocking mask, forming a second mask pattern on the first portion of the preliminary channel region after implanting the silicon ions and then etching the preliminary channel region using the second mask pattern as an etching mask to form the channel region and the barrier layer.

In various embodiments, forming the second mask pattern may include forming spacer patterns on opposing sidewalls of the first mask pattern.

According to various embodiments, forming the source/drain region may include epitaxially growing the source/drain region using the barrier layer as a seed layer.

According to various embodiments, forming the source/drain region may include forming a first source/drain region adjacent a first sidewall of the channel region such that the barrier layer may contact the first sidewall of the channel region and a sidewall of the first source/drain region. The method may further include forming a second source/drain region contacting a second sidewall of the channel region opposite the first sidewall of the channel region.

In various embodiments, the method may further include forming a contact region contacting an upper surface of the source/drain region.

According to various embodiments, a width of the barrier layer in a direction from the channel region to the source/drain region may be about 10 nm.

According to various embodiments, the method may further include forming a gate electrode overlying the channel region, and a sidewall of the barrier layer contacting the sidewall of the channel region may be substantially aligned to a sidewall of the gate electrode such that a junction may be formed in the barrier layer.

A method of forming a finFET device may include forming a fin-shaped channel region including germanium on a substrate, forming a source/drain region on a sidewall of the channel region on the substrate and forming a barrier layer between the sidewall of the channel region and a sidewall of the source/drain region. The barrier layer may include silicon and germanium, and a germanium concentration in the barrier layer may be less than a germanium concentration in the channel region.

According to various embodiments, forming the barrier layer may include forming the barrier layer including $Si_xGe_{1-x}$, and the value of x may be in a range of about 0.05 to about 0.2.

According to various embodiments, forming the channel region and the barrier layer may include forming a preliminary channel region on the substrate, forming a mask pattern on the preliminary channel region, etching the preliminary channel region using the mask pattern as an etching mask to form the channel region and then epitaxially growing the barrier layer using the channel region as a seed layer.

In various embodiments, forming the mask pattern may include forming a first mask pattern on the preliminary channel region and forming spacer patterns on opposing sidewalls of the first mask pattern.

According to various embodiments, forming the channel region and the barrier layer may include forming a preliminary channel region on the substrate, forming a first mask pattern on the preliminary channel region, implanting silicon ions into the preliminary channel region using the first mask pattern as an implantation blocking mask, forming a second mask pattern on the preliminary channel region after implanting the silicon ions and then etching the preliminary channel region using the second mask pattern as an etching mask to form the channel region and the barrier layer.

In various embodiments, forming the second mask pattern may include forming spacer patterns on opposing sidewalls of the first mask pattern.

According to various embodiments, forming the channel region may include forming the channel region including $Si_{1-y}Ge_y$, and forming the source/drain region may include forming a portion of the source/drain region including substantially pure germanium. The value of y may be in a range of about 0.8 to about 1. In various embodiments, the method may further include forming a contact region contacting an upper surface of the source/drain region, and the portion of the source/drain region including substantially pure germanium may contact the contact region. In various embodiments, a germanium concentration in the channel region may be greater than a germanium concentration in the barrier layer, and a germanium concentration in the source/drain region may be substantially equal to or greater than the germanium concentration in the barrier layer. The finFET may be a P-type finFET.

According to various embodiments, forming the channel region may include forming the channel region including $Si_{1-y}Ge_y$, and forming the source/drain region may include forming a portion of the source/drain region including substantially pure silicon. The value of y may be in a range of about 0.85 to about 1. In various embodiments, the method may further include forming a contact region contacting an upper surface of the source/drain region, and the portion of the source/drain region including substantially pure silicon may contact the contact region. In various embodiments, a germanium concentration in the channel region may be greater than a germanium concentration in the barrier layer. The finFET may be an N-type finFET.

In various embodiments, forming the source/drain region may include forming a first source/drain region on a first sidewall of the channel region such that the barrier layer may be disposed between the first sidewall of the channel region and a sidewall of the first source/drain region. The method may further include forming a second source/drain region contacting a second sidewall of the channel region opposite the first sidewall of the channel region such that the barrier layer may not be disposed between the second sidewall of the channel region and the second source/drain region.

According to various embodiments, a width of the barrier layer in a direction from the channel region to the source/drain region may be about 10 nm.

In various embodiments, the method may further include forming a gate electrode overlying the channel region, and a sidewall of the barrier layer facing the sidewall of the channel region may be substantially aligned to a sidewall of the gate electrode such that a junction may be formed in the barrier layer.

An integrated circuit device including a finFET may include a fin-shaped channel region including germanium on a substrate, a source/drain region adjacent the channel region on the substrate and a barrier layer contacting sidewalls of the channel region and the source/drain region. The barrier layer may include $Si_xGe_{1-x}$, and the value of x may be in a range of about 0.05 to about 0.2.

According to various embodiments, a germanium concentration in the channel region may be greater than a germanium concentration in the barrier layer.

In various embodiments, the channel region may include $Si_{1-y}Ge_y$, and the source/drain region may include a portion including substantially pure germanium. The value of y may be in a range of about 0.8 to about 1. A germanium concentration in the channel region may be greater than a germanium concentration in the barrier layer, and a germanium concentration in the source/drain region may be substantially equal to or greater than the germanium concentration in the barrier layer. According to various embodiments, the method may further include a contact region contacting an upper surface of the source/drain region, and the portion of the source/drain region including substantially pure germanium may contact the contact region.

In various embodiments, the channel region may include $Si_{1-y}Ge_y$, and the value of y may be in a range of about 0.85 to about 1. The source/drain region may include a portion including substantially pure silicon. A germanium concentration in the channel region may be greater than a germanium concentration in the barrier layer. According to various embodiments, the method may further include a contact region contacting an upper surface of the source/drain region. The portion of the source/drain region including substantially pure silicon may contact the contact region.

In various embodiments, the sidewall of the channel region contacting the barrier layer may include a first sidewall of the channel region. The source/drain region may include a first source/drain region such that the barrier layer may contact the first sidewall of the channel region and a sidewall of the first source/drain region. The device may further include a second source/drain region contacting a second sidewall of the channel region opposite the first sidewall of the channel region.

According to various embodiments, a width of the barrier layer in a direction from the channel region to the source/drain region may be about 10 nm.

In various embodiments, the device may further include a gate electrode overlying the channel region, and a sidewall of the barrier layer contacting the sidewall of the channel region may be substantially aligned to a sidewall of the gate electrode such that a junction may be formed in the barrier layer.

DETAILED DESCRIPTION

Figure 1:
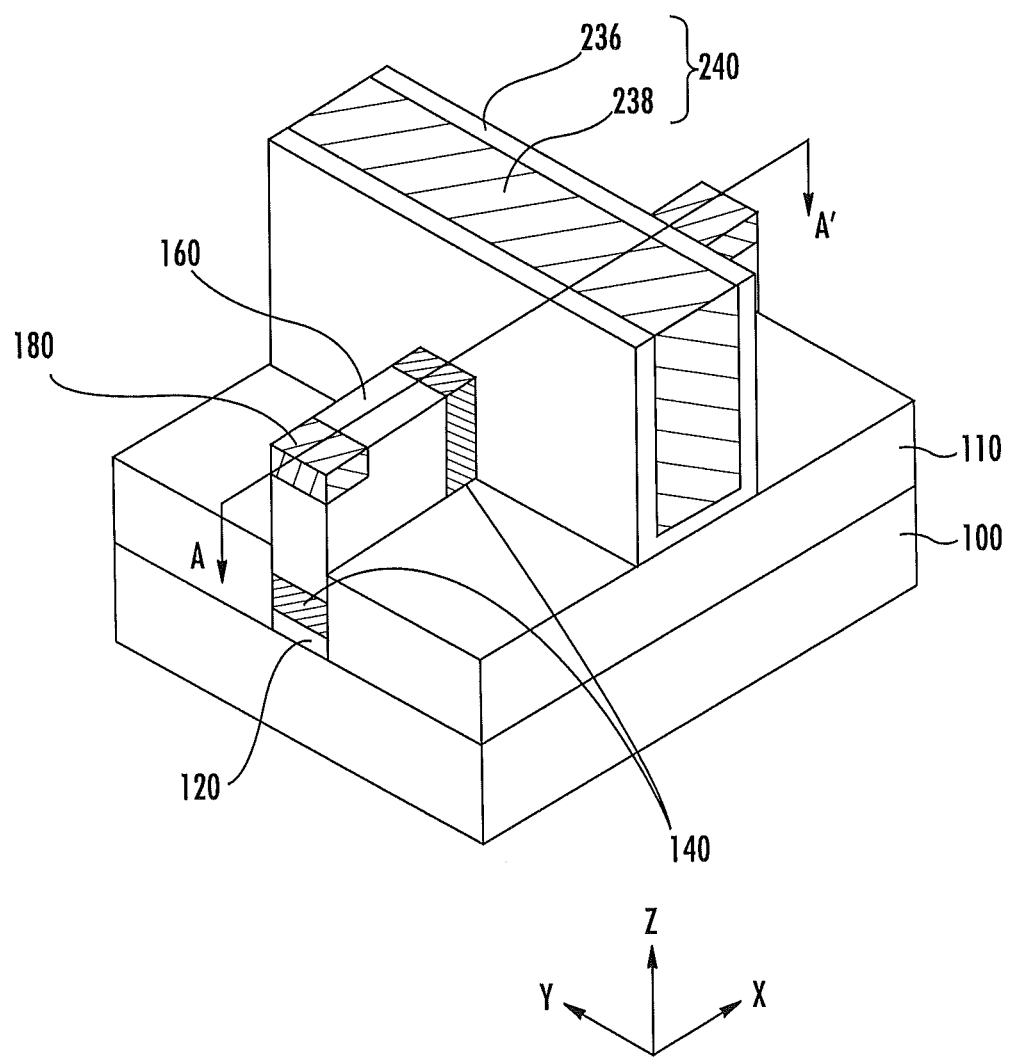
FIG. 1 is a perspective view illustrating an integrated circuit device according to some embodiments of the present inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional or perspective views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Using pure germanium channels may not improve device performances as anticipated due to a higher leakage current in a drain region. As appreciated by the present inventors, adding silicon into germanium (e.g., alloying germanium with silicon) can increase a direct bandgap and decrease a leakage current in a drain region. Methods of forming an integrated circuit device including fin field-effect transistors (FinFETs) according to various embodiments of the present inventive concept may include selectively forming a barrier layer, including germanium and silicon, in a tunneling region that is disposed between a channel region and a drain region.

Figure 2:
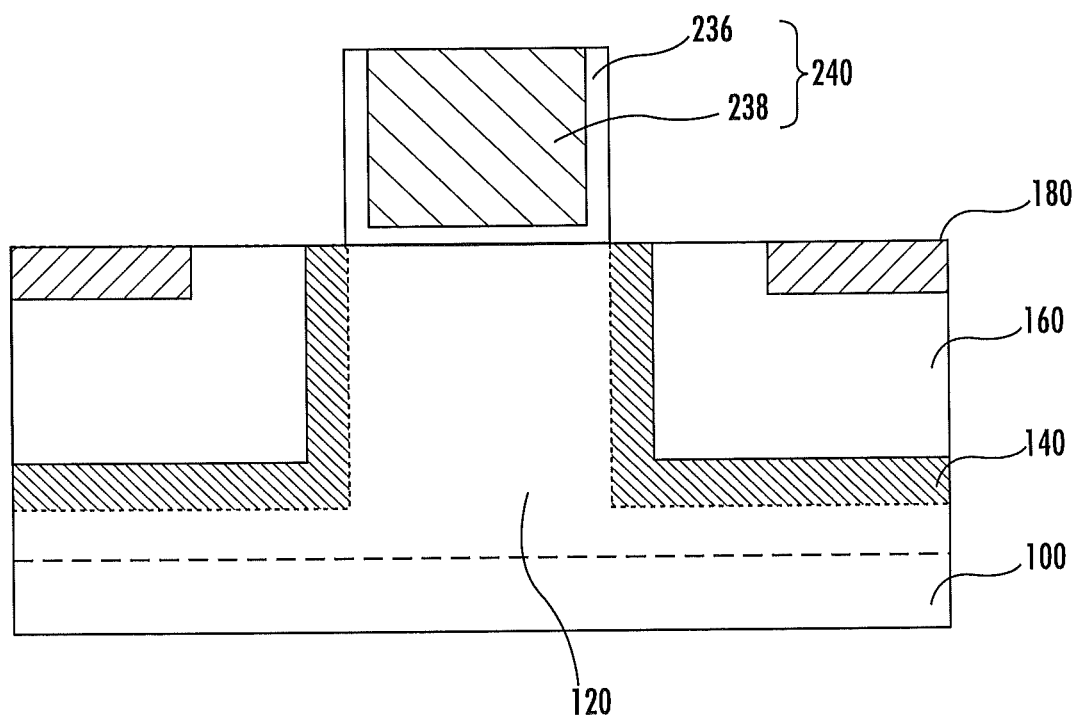
FIG. 2 is a cross-sectional view, taken along the line A-A' of FIG. 1, illustrating an integrated circuit device according to some embodiments of the present inventive concept.

FIG. 1 is a perspective view illustrating an integrated circuit device according to some embodiments of the present inventive concept, and FIG. 2 is a cross-sectional view, taken along the line A-A' of FIG. 1, illustrating an integrated circuit device according to some embodiments of the present inventive concept. The line A-A' extends in a X direction.

Referring to FIGS. 1 and 2, an integrated circuit device may include a substrate 100 and an isolation layer 110 disposed on the substrate. The integrated circuit device may also include a channel region 120 having a fin shape, which may be on the substrate 100 and partially in the isolation layer 110. The channel region 120 may include germanium (Ge). It will be understood that the channel region 120 may be comprised of $Si_{1-y}Ge_y$, and the value of y may be determined based on an appropriate level of strain.

In some embodiments, the channel region 120 may be comprised of $Si_{1-y}Ge_y$, and the value of y may be about 0.85 or greater when the channel region 120 is a channel region of an N-type transistor. In some alternative embodiments, the value of y may be about 0.9 or greater. In some alternative embodiments, the channel region 120 may be comprised of substantially pure germanium (i.e., the value of y is about 1) when the channel region 120 is a channel region of an N-type transistor for high carrier mobility. In some embodiments, the channel region 120 may be comprised of $Si_{1-y}Ge_y$, and the value of y may be about 0.8 or greater when the channel region 120 is a channel region of a P-type transistor. In some alternative embodiments, the value of y may be about 0.9 or greater.

The substrate 100 may include one or more semiconductor materials, for example, Si, Ge, SiGe, GaAs or SiGeC. In some embodiments, the substrate 100 may be a bulk silicon substrate or a semiconductor on insulator (SOI) substrate. The isolation layer 110 may include an insulating material such as, for example, silicon oxide.

A gate 240 may be formed on the channel region 120. The gate 240 may include a gate insulating layer 236 and a gate electrode 238. In some embodiments, the gate insulating layer 236 may include a high-k material having a higher dielectric constant than silicon oxide such as, for example, hafnium oxide (HfO2), lanthanum oxide, (La2O3), zirconium oxide, (ZrO2), and tantalum oxide (Ta2O5). The gate insulating layer 236 may be conformally formed on side walls and a bottom surface of the gate electrode 238 using, for example, an atomic layer deposition (ALD) process.

In some embodiments, the gate electrode 238 may include first and second gate electrodes stacked sequentially. For example, the first gate electrode may include one of TiN, TaN, TiC and TaC, and the second electrode may include W or Al.

According to FIG. 2, a barrier layer 140 may be disposed on a sidewall of the channel region 120. A barrier layer 140 may contact the sidewall of the channel region 120. The barrier layer 140 may include two barrier layers 140 disposed on respective opposing sidewalls of the channel region 120. In some embodiments, each of the barrier layers 140 may include a horizontal portion extending on an upper surface of the substrate 100 as illustrated in FIG. 2. The barrier layer 140 may include $Si_xGe_{1-x}$, and x may be in a range of about 0.05 to about 0.2. Accordingly, a germanium concentration in the barrier layer 140 may be less than a germanium concentration in the channel region 120.

A width of the barrier layer 140 may generally be on the order of 10 nm, and in some embodiments, the width of the barrier 140 may be about 10 nm. It will be understood that the width of the barrier layer 140 refers to a thickness of the barrier layer 140 in the X direction illustrated in FIG. 1. In some embodiments, the barrier layer 140 may include undoped and/or doped portions, and the doped portions may include, for example, boron (B) for a P-type finFET and phosphorous (P) or arsenic (As) for an N-type finFET as dopants. In some embodiments, a junction (e.g., P-N junction) may be formed outside of an edge of the gate electrode 238 such that the junction may not laterally overlap the gate electrode 238. The junction may be formed in the barrier layer 140. In some alternative embodiments, the junction may be formed inside of the edge of the gate electrode 238 such that the gate electrode 238 may laterally overlap the junction. Regardless of a position of the junction, embodiments reducing band-to-band tunneling current may include the barrier layer 140 including an alloy of germanium with silicon. Although FIG. 2 illustrates that a sidewall of the barrier layer 140 is aligned to a sidewall of the gate insulating layer 236 in FIG. 2, in some embodiments, the sidewall of the barrier layer 140 may be aligned to a sidewall of the gate electrode 238.

In some embodiments, a horizontal portion of the channel region 120 may extend between the upper surface of the substrate 100 and the horizontal portion of the barrier layer 140 as illustrated in FIG. 2. In some embodiments, however, the channel region 120 may not include a horizontal portion and thus the barrier layer 140 may contact the upper surface of the substrate 100.

The integrated circuit device may further include a source/drain region 160 disposed on a sidewall of the barrier layer 140 and a contact region 180 disposed on the source/drain region 160. Accordingly, the barrier layer 140 may be disposed in a tunneling region between the channel region 120 and the source/drain region 160. The contact region 180 may contact an upper surface of the source/drain region 160. The barrier layer 140 may contact sidewalls of the channel region 120 and the source/drain region 160. The contact region 180 may contact a conductive layer, which electrically connects the source/drain region 160 to various components of the integrated circuit device, for example, a bit line or a capacitor. The conductive layer may include a metal or a metal alloy.

It will be understood that the source/drain region 160 may include a portion including substantially pure silicon near the contact region 180 when the source/drain region 160 is in an N-type transistor, and the source/drain region 160 may include a portion including substantially pure germanium near the contact region 180 when the source/drain region 160 is in a P-type transistor. Accordingly, an N-type transistor according to some embodiments of the present inventive concept may have germanium concentrations in the channel region 120, the barrier layer 140 and the source/drain region 160, which decrease along a direction from the channel region 120 to the source/drain region 160. A P-type transistor according to some embodiments of the present inventive concept may have a germanium concentration in the channel region that is greater than a germanium concentration in the barrier layer and may have a germanium concentration in the source/drain region that is the substantially same as or greater than a germanium concentration in the barrier layer. In some embodiments, in an N-type transistor, the portion of the source/drain region 160 including substantially pure silicon may contact the contact region 180, whereas, in a P-type transistor, the portion of the source/drain region 160 including substantially pure germanium may contact the contact region 180.

Figure 3:
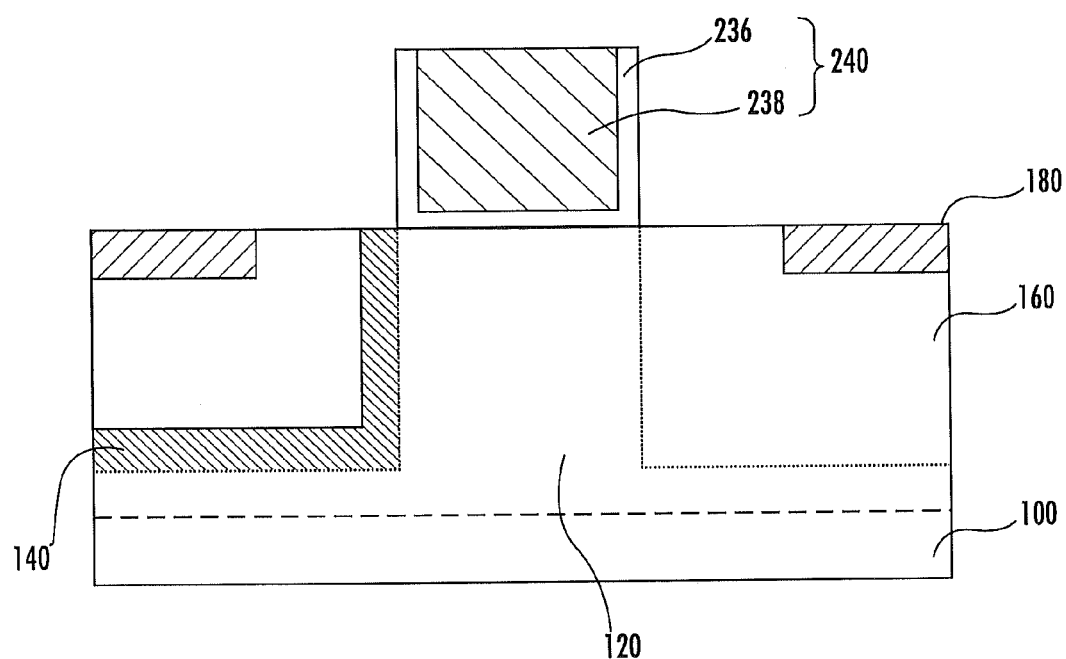
FIG. 3 is a cross-sectional view, taken along the line A-A' of FIG. 1, illustrating an integrated circuit device according to some embodiments of the present inventive concept.

FIG. 3 is a cross-sectional view, taken along the line A-A' of FIG. 1, illustrating an integrated circuit device according to some embodiments of the present inventive concept. Referring to FIG. 3, an integrated circuit device may include one barrier layer 140 disposed on a first sidewall of a channel region 120. Accordingly, a source/drain region 160 adjacent a second sidewall of the channel region 120, which is opposite the first sidewall of the channel region 120, may contact the second sidewall of the channel region 120. In other words, in some embodiments, the barrier layer 140 may be on only one of the sidewalls of the channel region 120 and the integrated circuit device may thus have an asymmetric structure.

Figure 4:
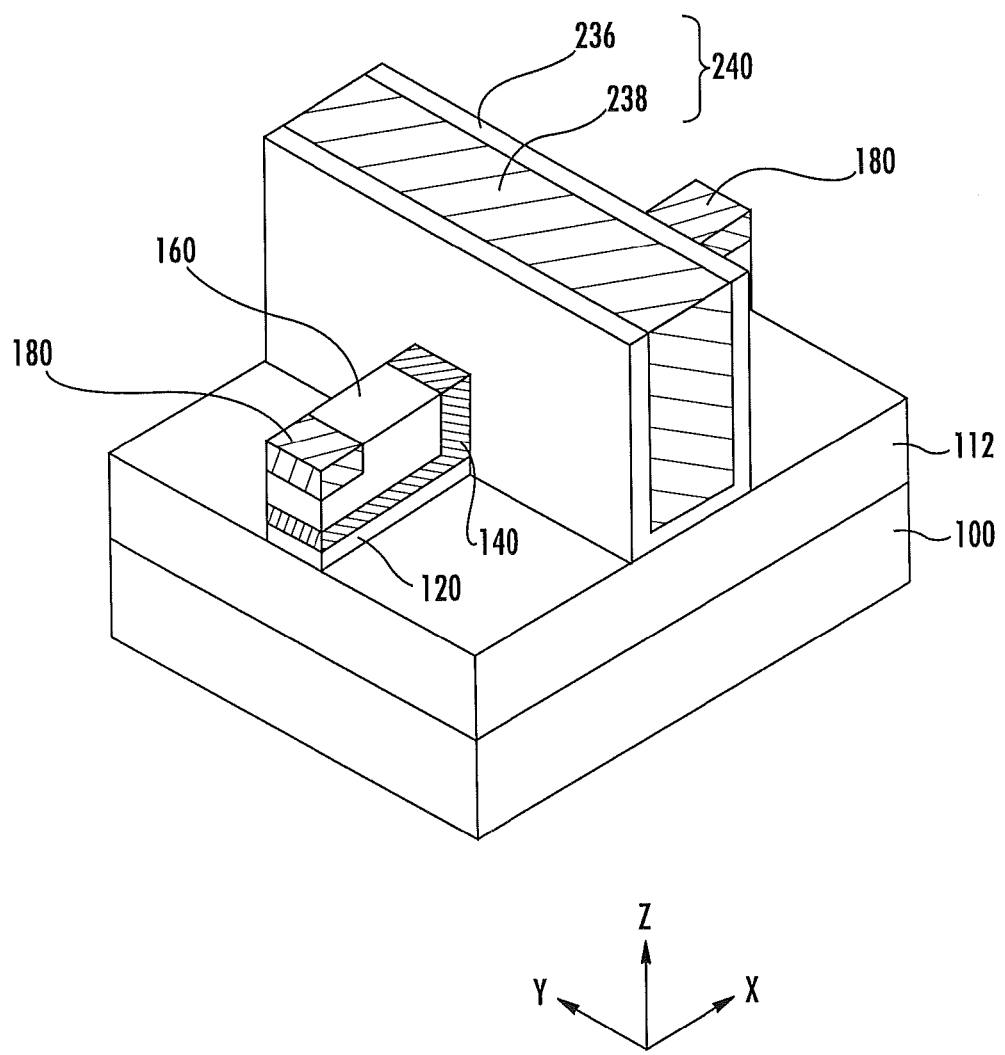
FIG. 4 is a perspective view illustrating an integrated circuit device according to some embodiments of the present inventive concept.

FIG. 4 is a perspective view illustrating an integrated circuit device according to some embodiments of the present inventive concept. Referring to FIG. 4, a buried isolation layer 112 may be disposed on a substrate 100 and a channel region 120 may be disposed on an upper surface of the buried isolation layer 112. The buried isolation layer 112 may be interposed between the substrate 100 and the channel region 120. It will be understood that the channel region 120 may be formed using a SOI manufacturing process, for example, a wafer bonding process.

Figure 5:
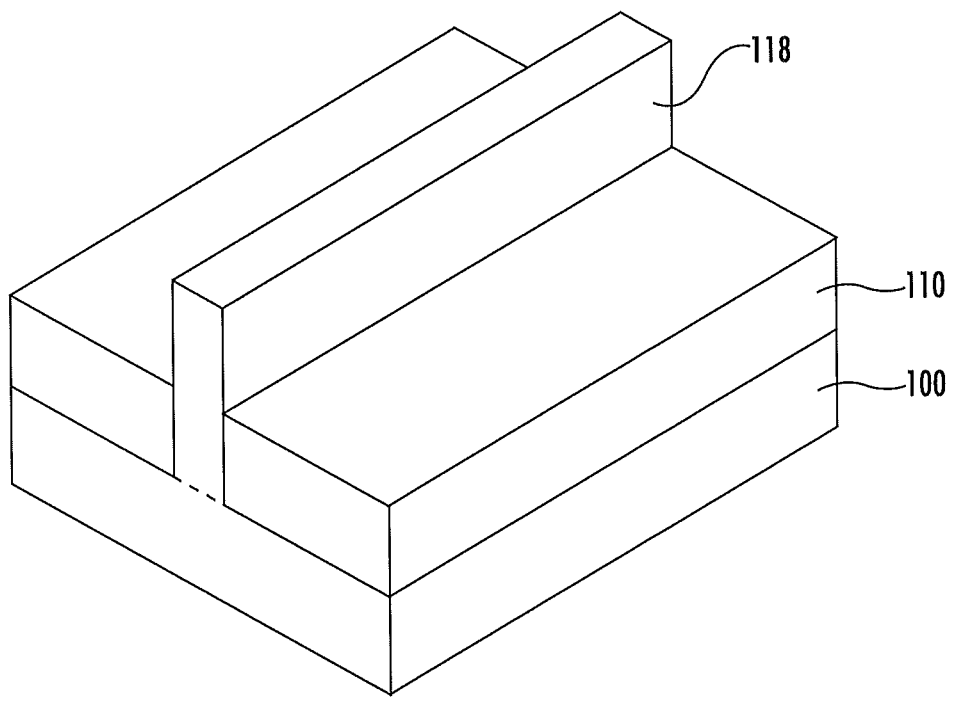
FIGS. 5 to 6 are perspective views illustrating intermediate structures provided as portions of a method of forming an integrated circuit device according to some embodiments of the present inventive concept.
Figure 5:
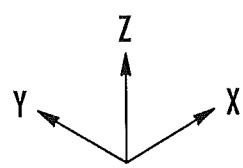
Figure 6:
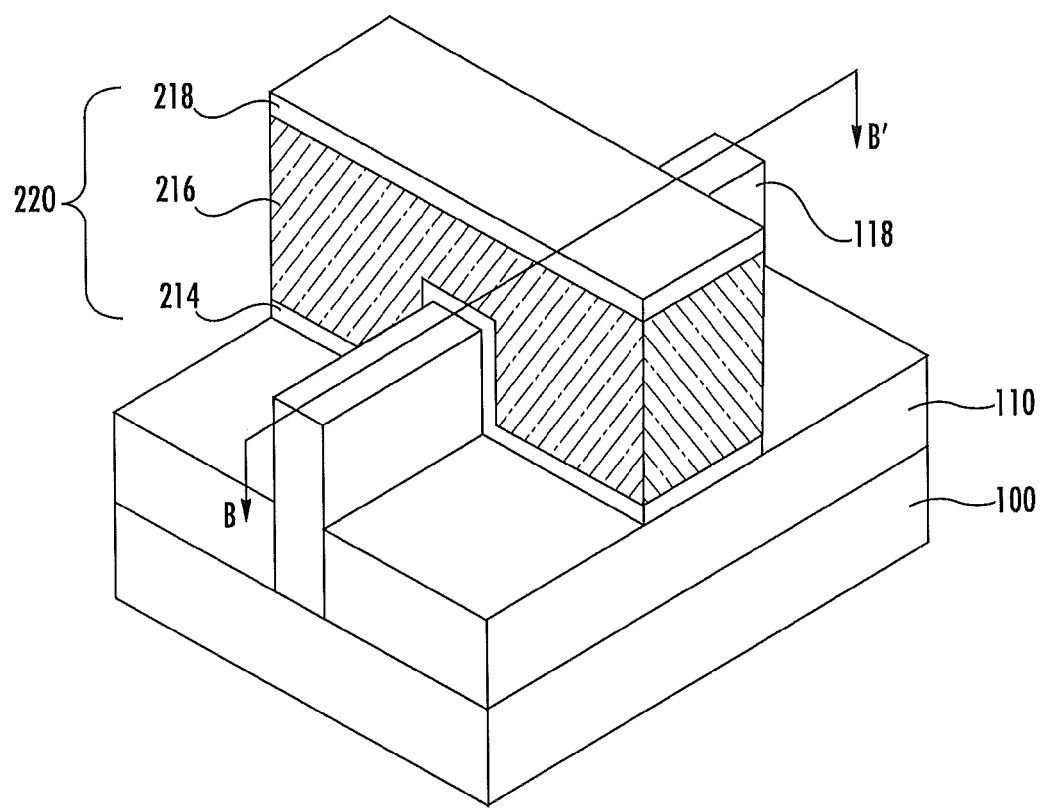
Figure 7:
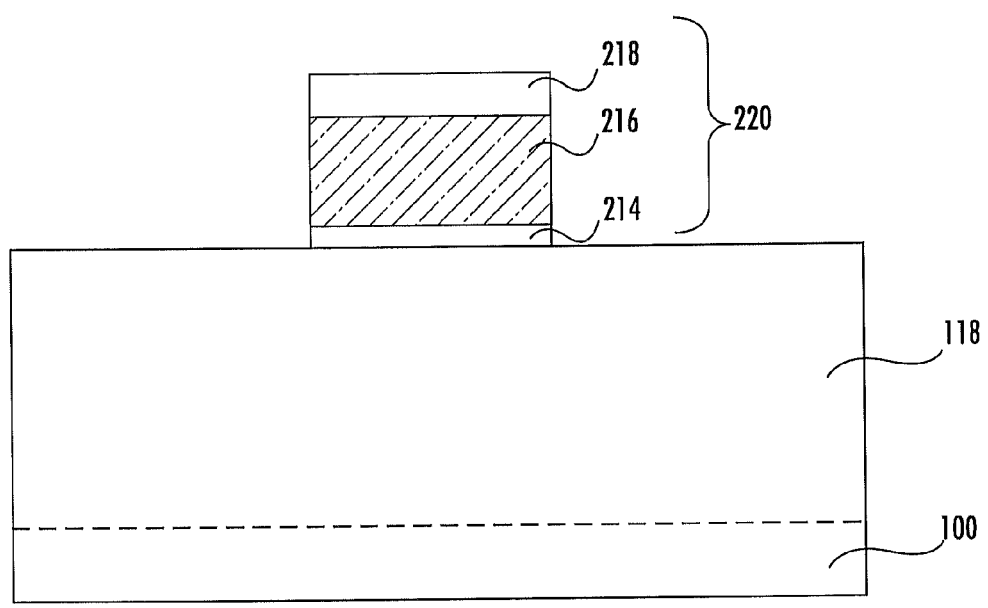
FIG. 7 is a cross-sectional view, taken along the line B-B' of FIG. 6, illustrating an intermediate structure provided as a portion of a method of forming an integrated circuit device according to some embodiments of the present inventive concept.

FIGS. 5 and 6 are perspective views illustrating intermediate structures provided as portions of a method of forming an integrated circuit device according to some embodiments of the present inventive concept. FIG. 7 is a cross-sectional view, taken along the line B-B' of FIG. 6, illustrating an intermediate structure provided as a portion of a method of forming an integrated circuit device according to some embodiments of the present inventive concept. Referring to FIG. 5, an isolation layer 110 and a preliminary channel region 118 may be formed on a substrate 100. A lower portion of the preliminary channel region 118 may be in the isolation layer 110, and opposing sidewalls of the preliminary channel region 118 may contact the isolation layer 110. The preliminary channel region 118 may have a line shape extending in an X direction. In some embodiments, the preliminary channel region 118 may be formed using an epitaxial growth process using the substrate 100 as a seed layer.

According to FIGS. 6 and 7, a preliminary gate 220 may be formed on the preliminary channel region 118. The preliminary gate 220 may have a line shape extending in a Y direction that is substantially perpendicular to the X direction. Accordingly, the preliminary gate 220 may cross over the preliminary channel region 118. The preliminary gate 220 may include a preliminary gate insulating layer 214, a preliminary gate electrode 216 and a mask pattern 218. For example, the preliminary gate insulating layer 214 may include an oxide, the preliminary gate electrode 216 may include polysilicon, and the mask pattern 218 may include a material that has an etch selectivity with respect to the preliminary gate insulating layer 214 and the preliminary gate electrode 216.

Figure 8:
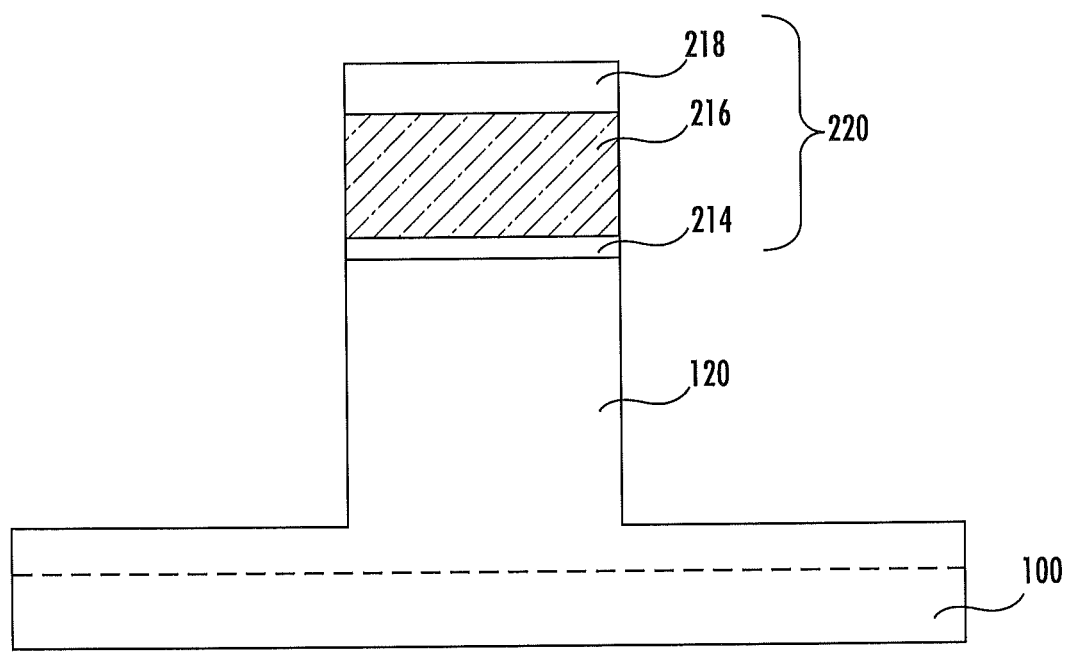
FIGS. 8 through 10 are cross-sectional views, taken along the line B-B' of FIG. 6, illustrating intermediate structures provided as portions of a method of forming an integrated circuit device according to some embodiments of the present inventive concept.
Figure 9:
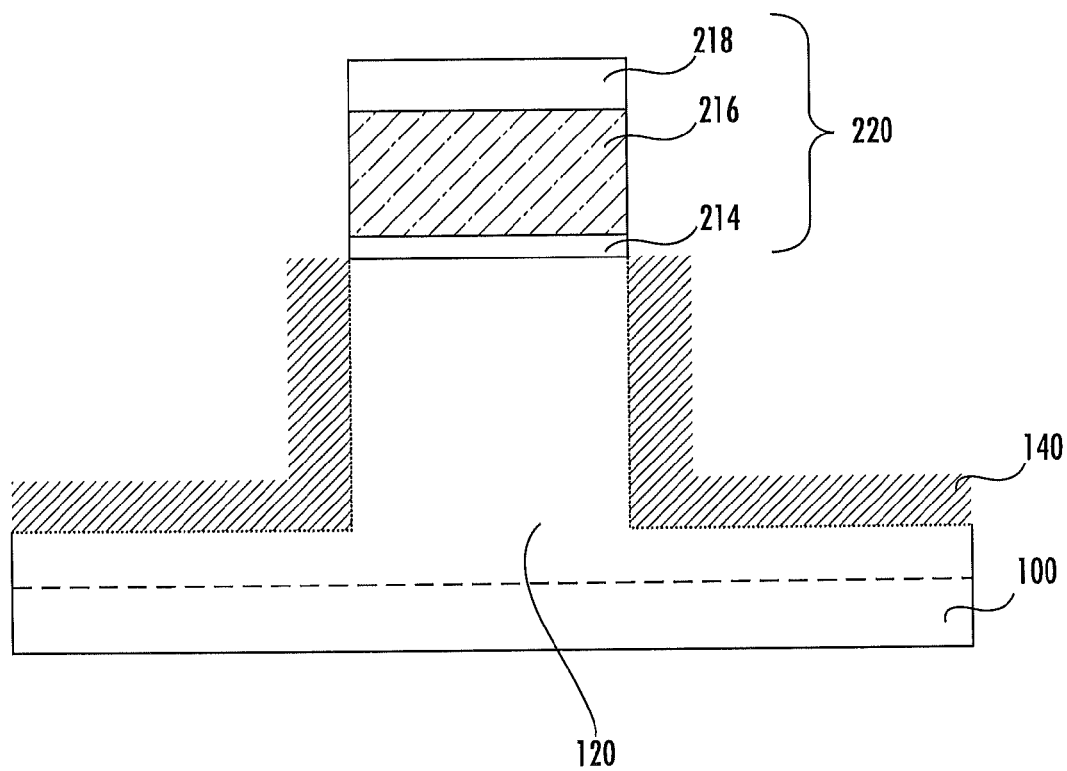
Figure 10:
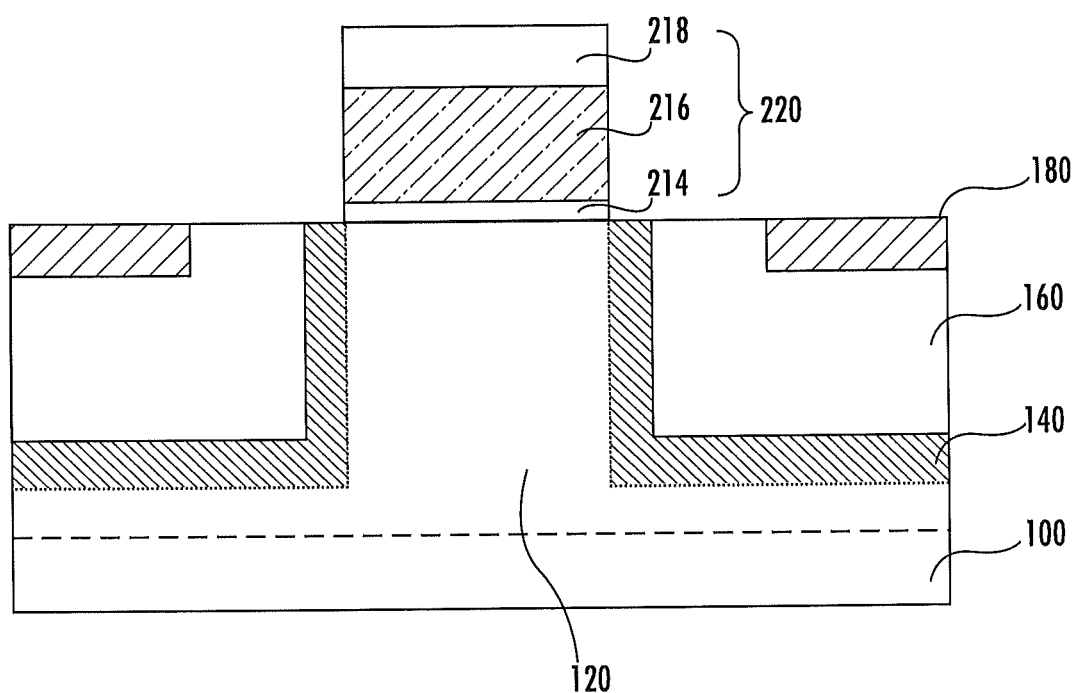

FIGS. 8 through 10 are cross-sectional views, taken along the line B-B' of FIG. 6, illustrating intermediate structures provided as portions of a method of forming an integrated circuit device according to some embodiments of the present inventive concept. Referring to FIG. 8, the preliminary channel region 118 may be etched using the preliminary gate 220 as an etch mask to form the channel region 120. A sidewall of the preliminary gate 220 and a sidewall of the channel region 120 may be substantially vertically aligned to each other. The preliminary channel region 118 may be etched until a horizontal portion of the channel region 120 extending on the upper surface of the substrate 100 reaches a predetermined thickness as illustrated in FIG. 8. Stated in other words, the preliminary channel region 118 may be etched until a depth of an etched portion of the preliminary channel region 118 reaches a predetermined depth. In some embodiments, the preliminary channel region 118 may be etched until the upper surface of the substrate 100 is exposed.

It will be understood that an offset spacer may be formed on the sidewall of the preliminary gate 220 before etching the preliminary channel region 118, and the offset spacer may be used as an etch mask, along with the preliminary gate 220, when the preliminary channel region 118 is etched. Accordingly, in some embodiments, a sidewall of the channel region 120 may laterally protrude from the sidewall of the preliminary gate 220. In some embodiments, a sidewall of the preliminary gate 220 and a sidewall of the channel region 120 may be substantially vertically aligned to each other, as illustrated in FIG. 8, even when the offset spacer is used as an etch mask due to a lateral recess of the preliminary channel region 118 under the offset spacer. The offset spacer may include a material that has an etch selectivity with respect to the preliminary channel region 118, and the offset spacer may include, for example, silicon nitride.

Referring to FIG. 9, a barrier layer 140 may be formed on the channel region 120. An epitaxial growth process may be performed to form the barrier layer 140, and the channel region 120 may be used as a seed layer. The barrier layer 140 may include $Si_xGe_{1-x}$, and x may be in a range of about 0.05 to about 0.2. In some embodiments, the barrier layer 140 may have a substantially uniform composition through the barrier layer 140 such that x may be a constant through the barrier layer 140. It will be understood that, however, the barrier layer 140 may have a variable composition. For example, a silicon concentration may have a gradient through the barrier layer 140 and x may be understood as an average value of x in the barrier layer 140.

A sidewall of the barrier layer 140 may be substantially vertically aligned to the sidewall of the preliminary gate 220 as illustrated in FIG. 9 when the sidewall of the preliminary gate 220 and the sidewall of the channel region 120 are substantially vertically aligned to each other before forming the barrier layer 140. As discussed with reference to FIG. 8, in some embodiments, the sidewall of the channel region 120 may laterally protrude from the sidewall of the preliminary gate 220 before forming the barrier layer 140, and the sidewall of the barrier layer 140 may thus laterally protrude from the sidewall of the preliminary gate 220. The width of the barrier layer may generally be on the order of 10 nm, and in some embodiments, the width of the barrier layer 140 may be about 10 nm. In some embodiments, the barrier layer 140 may include undoped and/or doped portions. For example, the doped portion may include boron (B) for a P-type finFET and phosphorous (P) or arsenic (As) for an N-type finFET as dopants.

According to FIG. 10, a source/drain region 160 may be formed on the barrier layer 140. The source/drain region 160 may be formed using an epitaxial growth process, and the barrier layer 140 may be used as a seed layer. It will be understood that the epitaxial growth processes to form the barrier layer 140 and the source/drain region 160 may be performed in the same process chamber. In some embodiments, in an N-type transistor, the source/drain region 160 may include a portion including substantially pure silicon near the contact region 180, whereas, in a P-type transistor, the source/drain region 160 may include a portion including substantially pure germanium near the contact region 180. A contact region 180 may be formed on the source/drain regions 160 and may contact an upper surface of the source/drain regions 160.

Referring again to FIG. 2, the gate 240 may be formed on the channel region 120. In some embodiments, the preliminary gate 220 may be replaced with the gate 240 using, for example, a replacement gate process. When a replacement gate process is used, the method may include forming an interlayer insulating layer on the channel region 120 and on sidewalls of the preliminary gate 220. Spacers may be formed on opposing sidewalls of the preliminary gate 220 before forming the interlayer insulating layer. The preliminary gate insulating layer 214, the preliminary gate electrode 216 and the mask pattern 218 may be removed using etching processes, wet and/or dry etch processes, to form a trench in the interlayer insulating layer. Then the gate insulating layer 236 and the gate electrode 238 may be formed in the trench.

Figure 11:
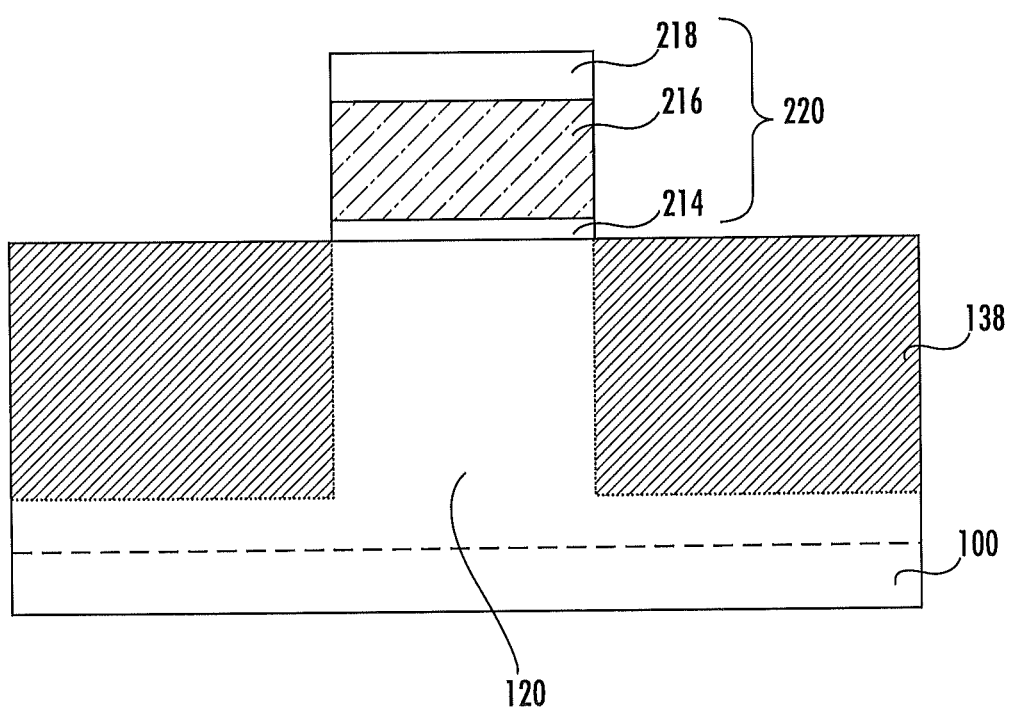
FIGS. 11 through 13 are cross-sectional views, taken along the line B-B' of FIG. 6, illustrating intermediate structures provided as portions of a method of forming an integrated circuit device according to some embodiments of the present inventive concept.
Figure 12:
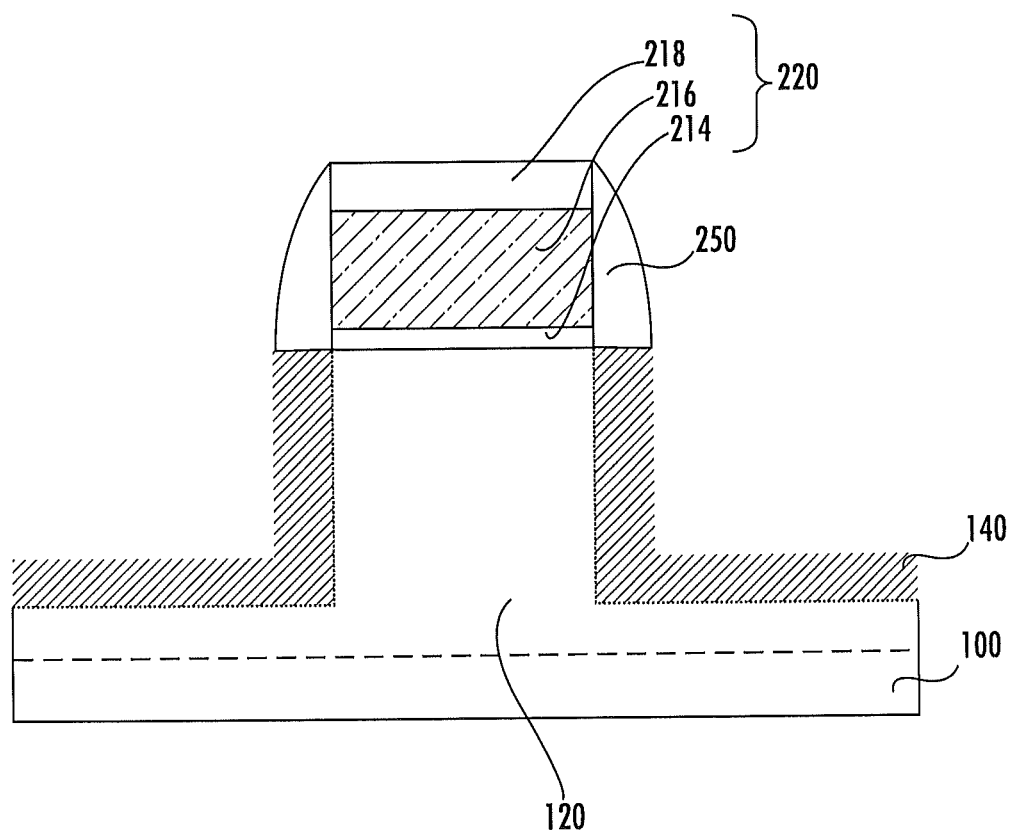
Figure 13:
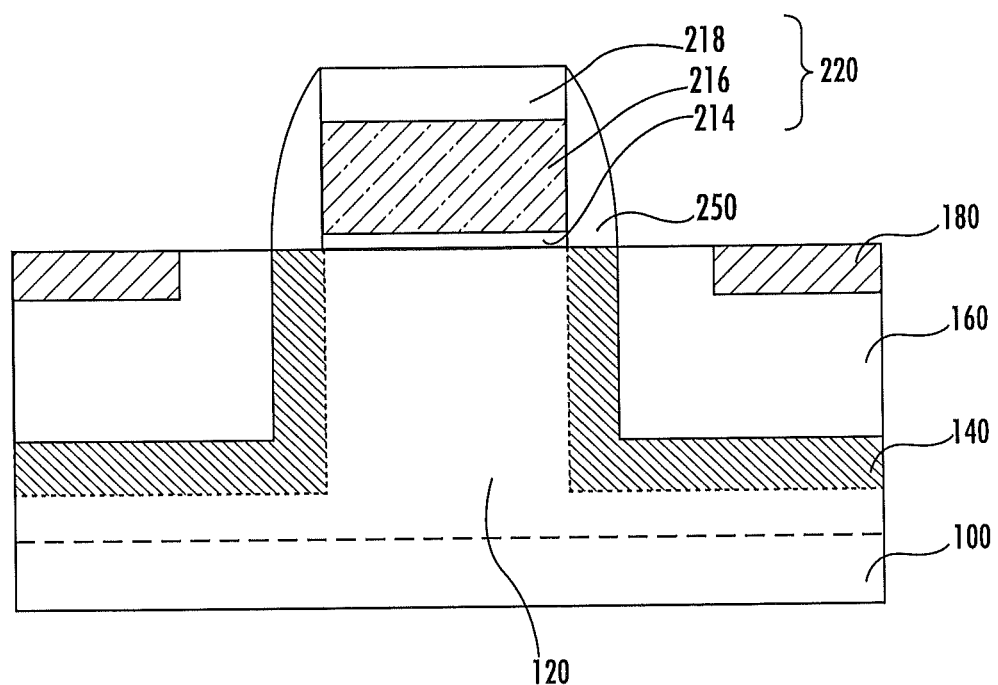

FIGS. 11 through 13 are cross-sectional views, taken along the line B-B' of FIG. 6, illustrating intermediate structures provided as portions of a method of forming an integrated circuit device according to some embodiments of the present inventive concept. Referring to FIG. 11, after the structure illustrated in FIG. 7 is formed, an ion implantation process may be performed to implant silicon ions into the preliminary channel region 118 using the preliminary gate 220 as an implantation mask layer. Accordingly, a portion of the preliminary channel region 118 that is exposed by the preliminary gate 220 may be converted into a preliminary barrier layer 138 including silicon. The preliminary barrier layer 138 may include $Si_xGe_{1-x}$, and x may be in a range of about 0.05 to about 0.2. The preliminary barrier layer 138 may be amorphous after the ion implantation process is performed, and thus an anneal process may be performed to crystallize the preliminary barrier layer 138.

A thickness of the preliminary barrier layer 138 may be determined based on an energy level of the ion implantation process. For example, the thickness of the preliminary barrier layer 138 may increase as the energy level of the ion implantation process increases. In some embodiments, only an upper portion of the preliminary channel region 118 may be converted into the preliminary barrier layer 138 as illustrated in FIG. 11 such that a horizontal portion of the channel region 120 may extend between an upper surface of the substrate 100 and the preliminary barrier layer 138. It will be understood that, however, an entire portion of the preliminary channel region 118 in a vertical direction may be converted into the preliminary barrier layer 138, and the preliminary barrier layer 138 may contact the upper surface of the substrate 100.

According to FIG. 12, offset spacers 250 may be formed on opposing sidewalls of the preliminary gate 220 and then the preliminary barrier layer 138 may be etched using the offset spacers 250 and the preliminary gate 220 as an etch mask to form a barrier layer 140. The preliminary barrier layer 138 may be etched until a portion of the preliminary barrier layer 138 extending on the upper surface of the substrate 100 reaches a predetermined thickness as illustrated in FIG. 12. Stated in other words, the preliminary barrier layer 138 may be etched until a depth of an etched portion of the preliminary barrier layer 138 reaches a predetermined depth. In some embodiments, the preliminary barrier layer 138 may be etched until the upper surface of the channel region 112 is exposed.

A source/drain region 160 may be formed on the barrier layer 140 (FIG. 13). The source/drain region 160 may be formed using an epitaxial growth process, and the barrier layer 140 may be used as a seed layer. Referring again to FIG. 2, the gate 240 may be formed on the channel region 120. The preliminary gate 220 may be replaced with the gate 240 using, for example, a replacement gate process.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed:

1. A method of forming a finFET, the method comprising:
    forming a fin-shaped channel region comprising germanium on a substrate;
    forming a source/drain region adjacent the channel region on the substrate; and
    forming a barrier layer comprising opposing sidewalls contacting sidewalls of the channel region and the source/drain region, respectively, wherein the barrier layer comprises $Si_xGe_{1-x}$, and x is in a range of about 0.05 to about 0.2.

2. The method of claim 1, wherein a germanium concentration in the channel region is greater than a germanium concentration in the barrier layer.

3. The method of claim 1, wherein:
    forming the channel region comprises forming the channel region comprising $Si_{1-y}Ge_y$, and y is in a range of about 0.8 to about 1; and
    forming the source/drain region comprises forming a portion of the source/drain region comprising substantially pure germanium.

4. The method of claim 3, wherein:
    a germanium concentration in the channel region is greater than a germanium concentration in the barrier layer; and
    a germanium concentration in the source/drain region is substantially equal to or greater than the germanium concentration in the barrier layer.

5. The method of claim 1, wherein:
    forming the channel region comprises forming the channel region comprising $Si_{1-y}Ge_y$, and y is in a range of about 0.85 to about 1; and
    forming the source/drain region comprises forming a portion of the source/drain region comprising substantially pure silicon.

6. The method of claim 5, wherein a germanium concentration in the channel region is greater than a germanium concentration in the barrier layer.

7. The method of claim 1, wherein forming the channel region and the barrier layer comprises:
    forming a preliminary channel region on the substrate;
    forming a mask pattern on the preliminary channel region;
    etching the preliminary channel region using the mask pattern as an etching mask to form the channel region; and
    epitaxially growing the barrier layer using the channel region as a seed layer.

8. The method of claim 1, wherein:
    forming the source/drain region comprises forming a first source/drain region adjacent a first sidewall of the channel region such that the barrier layer contacts the first sidewall of the channel region and a sidewall of the first source/drain region; and
    the method further comprises forming a second source/drain region contacting a second sidewall of the channel region opposite the first sidewall of the channel region.

9. The method of claim 1, wherein a width of the barrier layer in a direction from the channel region to the source/drain region is about 10 nm.

10. The method of claim 1, further comprising forming a gate electrode overlying the channel region, wherein a sidewall of the barrier layer contacting the sidewall of the channel region is substantially aligned to a sidewall of the gate electrode such that a junction is formed in the barrier layer.

11. The method of claim 1, wherein the barrier layer separates the sidewalls of the channel region and the source/drain region.

12. A method of forming a finFET, the method comprising:
    forming a fin-shaped channel region comprising germanium on a substrate;
    forming a source/drain region adjacent the channel region on the substrate; and
    forming a barrier layer contacting sidewalls of the channel region and the source/drain region, wherein the barrier layer comprises $Si_xGe_{1-x}$, and x is in a range of about 0.05 to about 0.2, and wherein forming the channel region and the barrier layer comprises:
    forming a preliminary channel region on the substrate;
    forming a first mask pattern on a first portion of the preliminary channel region;
    implanting silicon ions into the preliminary channel region using the first mask pattern as an implantation blocking mask;
    forming a second mask pattern on the first portion of the preliminary channel region after implanting the silicon ions; and etching the preliminary channel region using the second mask pattern as an etching mask to form the channel region and the barrier layer.

13. A method of forming a finFET, the method comprising:
forming a fin-shaped channel region comprising germanium on a substrate;
forming a source/drain region on a sidewall of the channel region on the substrate; and
forming a barrier layer between the sidewall of the channel region and a sidewall of the source/drain region, wherein:
the barrier layer comprises silicon and germanium; and
a germanium concentration in the barrier layer is less than a germanium concentration in the channel region.

14. The method of claim 13, wherein forming the barrier layer comprises forming the barrier layer comprising $Si_xGe_{1-x}$, and x is in a range of about 0.05 to about 0.2.

15. The method of claim 13, wherein;
forming the channel region comprises forming the channel region comprising $Si_{1-y}Ge_y$, and y is in a range of about 0.8 to about 1; and
forming the source/drain region comprises forming a portion of the source/drain region comprising substantially pure germanium.

16. The method of claim 15, wherein:
a germanium concentration in the channel region is greater than a germanium concentration in the barrier layer; and
a germanium concentration in the source/drain region is substantially equal to or greater than the germanium concentration in the barrier layer.

17. The method of claim 13, wherein;
forming the channel region comprises forming the channel region comprising $Si_{1-y}Ge_y$, and y is in a range of about 0.85 to about 1; and
forming the source/drain region comprises forming a portion of the source/drain region comprising substantially pure silicon.

18. The method of claim 17, wherein a germanium concentration in the channel region is greater than a germanium concentration in the barrier layer.

19. The method of claim 13, wherein:
forming the source/drain region comprises forming a first source/drain region on a first sidewall of the channel region such that the barrier layer is disposed between the first sidewall of the channel region and a sidewall of the first source/drain region; and
the method further comprises forming a second source/drain region contacting a second sidewall of the channel region opposite the first sidewall of the channel region.

20. The method of claim 13, wherein a width of the barrier layer in a direction from the channel region to the source/drain region is about 10 nm.

21. The method of claim 13, further comprising forming a gate electrode overlying the channel region, wherein a sidewall of the barrier layer facing the sidewall of the channel region is substantially aligned to a sidewall of the gate electrode such that a junction is formed in the barrier layer.

22. The method of claim 13, wherein the barrier layer separates the sidewalls of the channel region and the source/drain region.

* * * * *